(12) United States Patent
Lee et al.

(10) Patent No.: US 11,901,464 B2
(45) Date of Patent: Feb. 13, 2024

(54) SOLAR CELL PANEL

(71) Applicant: Shangrao Jinko solar Technology Development Co., LTD, Jiangxi (CN)

(72) Inventors: Hyunho Lee, Seoul (KR); Donghae Oh, Seoul (KR); Jaewon Chang, Seoul (KR); Jinsung Kim, Seoul (KR)

(73) Assignee: SHANGRAO XINYUAN YUEDONG TECHNOLOGY DEVELOPMENT CO. LTD., Jiangxi (CN)

( * ) Notice: Subject to any disclaimer, the term of this patent is extended or adjusted under 35 U.S.C. 154(b) by 159 days.

(21) Appl. No.: 16/127,856

(22) Filed: Sep. 11, 2018

(65) Prior Publication Data
US 2019/0081185 A1    Mar. 14, 2019

(30) Foreign Application Priority Data

Sep. 11, 2017  (KR) .................. 10-2017-0115735
Jul. 10, 2018  (KR) .................. 10-2018-0080116

(51) Int. Cl.
*H01L 31/02* (2006.01)
*H01L 31/0224* (2006.01)
(Continued)

(52) U.S. Cl.
CPC .. *H01L 31/0201* (2013.01); *H01L 31/022433* (2013.01); *H01L 31/035281* (2013.01); *H01L 31/0504* (2013.01); *H01L 31/0508* (2013.01)

(58) Field of Classification Search
CPC ......... H01L 31/0201; H01L 31/022433; H01L 31/035281; H01L 31/0504; H01L 31/0508
See application file for complete search history.

(56) References Cited

U.S. PATENT DOCUMENTS

2015/0349145 A1* 12/2015 Morad ................ H01L 31/1876
136/261
2016/0093752 A1   3/2016 Kim et al.
(Continued)

FOREIGN PATENT DOCUMENTS

CN    106531829    3/2017
CN    107004729    8/2017
(Continued)

OTHER PUBLICATIONS

Extended European Search Report in European Appln. No. EP 18193397.9-1230, dated Mar. 14, 2019, 8 pages.
(Continued)

*Primary Examiner* — Tamir Ayad
(74) *Attorney, Agent, or Firm* — Tucker Ellis LLP

(57) ABSTRACT

A solar cell panel that includes: a plurality of solar cells that include a first solar cell and a second solar cell, the plurality of solar cells having respective lengths in a first direction and respective widths in a second direction; and one or more connecting members that electrically connect two adjacent solar cells of the plurality of solar cells, wherein the first solar cell includes a first inclined portion at a first side of the first solar cell, wherein the second solar cell includes a second inclined portion at a first side of the second solar cell, and wherein a first width of the first solar cell in the second direction is different from a second width of the second solar cell in the second direction is disclosed.

14 Claims, 6 Drawing Sheets

(51) Int. Cl.
*H01L 31/05* (2014.01)
*H01L 31/0352* (2006.01)

(56) References Cited

U.S. PATENT DOCUMENTS

| | | | |
|---|---|---|---|
| 2016/0158890 A1* | 6/2016 | Gonzalez | ............... H01L 22/26 |
| | | | 438/5 |
| 2016/0163910 A1 | 6/2016 | Gonzalez et al. | |
| 2017/0017933 A1 | 6/2017 | Gonzalez et al. | |
| 2017/0301801 A1* | 10/2017 | Nguyen | ............. H01L 31/0747 |

FOREIGN PATENT DOCUMENTS

| | | |
|---|---|---|
| JP | 2005252043 | 9/2005 |
| JP | 2014195028 | 10/2014 |
| JP | 2017517145 A | 6/2017 |
| WO | 2012073935 A1 | 6/2012 |

OTHER PUBLICATIONS

Office Action in Chinese Appln. No. 201811043020.1, dated Aug. 30, 2021, 14 pages (with English translation).
Notice of Allowance in Chinese Appln. No. 201811043020.1, dated Jan. 26, 2022.
First Office Action of corresponding Chinese Application No. 2018168524, dated Jul. 19, 2022, 10 pages.

* cited by examiner (a)          (b)

ions of the invention relate to a solar cell
SOLAR CELL PANEL

CROSS-REFERENCE TO RELATED APPLICATION

This application claims priority to and the benefit of Korean Patent Application No. 10-2017-0115735 filed on Sep. 11, 2017 and Korean Patent Application No. 10-2018-0080116 filed on Jul. 10, 2018 in the Korean Intellectual Property Office, the entire contents of which are incorporated herein by reference.

TECHNICAL FIELD

Implementations of the invention relate to a solar cell panel, and, more particularly, to a solar cell panel having an improved structure.

BACKGROUND

Recently, as existing energy resources such as petroleum and coal are expected to be depleted, interest in alternative energy to replace them is increasing. Among them, solar cells are attracting attention as a next-generation battery that converts solar energy into electric energy.

SUMMARY

A plurality of solar cells are connected in series or in parallel, and are manufactured in the form of a solar cell panel by a packaging process for protecting the plurality of solar cells. For example, a solar cell panel may be manufactured by connecting a plurality of solar cells using an overlapped portion in which a part of neighboring solar cells is overlapped. However, in this structure, areas contributing to a photoelectric conversion in respective solar cells are different from each other due to an arrangement of electrodes or overlapped portions, and current amounts in respective solar cells are different from each other. Then, at least a part of the current may be lost because current flows at a minimum current amount and, and thus, output of a solar cell panel may be lowered.

Therefore, implementations of the invention have been made in view of the above problems, and implementations of the invention are to provide a solar cell panel being able to minimize output loss and increase output.

In general, one innovative aspect of the subject matter described in this specification can be implemented in a solar cell panel comprising: a plurality of solar cells that include a first solar cell and a second solar cell, the plurality of solar cells having respective lengths in a first direction and respective widths in a second direction; and one or more connecting members that electrically connect two adjacent solar cells of the plurality of solar cells, wherein the first solar cell includes a first inclined portion at a first side of the first solar cell, wherein the second solar cell includes a second inclined portion at a first side of the second solar cell, and wherein a first width of the first solar cell in the second direction is different from a second width of the second solar cell in the second direction.

The foregoing and other implementations can each optionally include one or more of the following features, alone or in combination. In particular, one implementation includes all the following features in combination. Edge portions of two adjacent solar cells of the plurality of solar cells overlap each other, and wherein a first connecting member of the one or more connecting members is positioned between the edge portions of the two adjacent solar cells of the plurality of solar cells, the first connecting member electrically connecting the two adjacent solar cells to each other. Each of the first solar cell and the second solar cell includes a photoelectric conversion portion and an electrode that is connected to the photoelectric conversion portion, wherein the photoelectric conversion portion of the first solar cell and the photoelectric conversion portion of the second solar cell have an asymmetrical shape, and wherein the electrode of the first solar cell and the electrode of the second solar cell have a symmetrical shape or structure. The first solar cell and the second solar cell have an asymmetrical shape. The first width of the first solar cell in the second direction is smaller than the second width of the second solar cell in the second direction. The first solar cell includes a first bus bar electrode that is located at a second side of the first solar cell, the second side of the first solar cell being different from the first side of the first solar cell, and wherein the second solar cell includes a second bus bar electrode that is located at the first side of the second solar cell. A first distance between a second side of the first solar cell and a first electrode of the first solar cell is different from a second distance between the first side of the second solar cell and a second electrode of the second solar cell, the second side of the first solar cell being different from the first side of the first solar cell. The first width of the first solar cell in the second direction is smaller than the second width of the second solar cell in the second direction, and wherein the first distance is smaller than the second distance. A ratio of the second width of the second solar cell in the second direction to the first width of the first solar cell in the second direction is between 1.018 and 1.055. At least one of the plurality of solar cells includes a plurality of finger electrodes that are arranged in parallel in the first direction and that are spaced apart from each other. The plurality of solar cells includes a third solar cell that has a different shape than a shape of the first solar cell and a shape of the second solar cell. The third solar cell has a rectangular shape. The plurality of solar cells includes a third solar cell, and wherein a third width of the third solar cell in the second direction is different from the first width of the first solar cell in the second direction and the second width of the second solar cell in the second direction. The first width of the first solar cell in the second direction is smaller than the second width of the second solar cell in the second direction, and wherein the third width of the third solar cell in the second direction is smaller than the first width of the first solar cell in the second direction and the second width of the second solar cell in the second direction. A second side of the first solar cell overlaps a first side of the third solar cell, wherein a second side of the third solar cell overlaps the first side of the second solar cell, and wherein a third distance between the second side of the third solar cell and a third electrode of the third solar cell is smaller than a second distance between the second side of the second solar cell and a second electrode of the second solar cell. A width of a first effective portion of the first solar cell is larger than a width of a third effective portion of the third solar cell, and wherein the width of the first effective portion of the first solar cell is larger than a width of a second effective portion of the second solar cell, the first effective portion being a portion of the first solar cell other than a portion of the first solar cell overlapping the first side of the third solar cell, the second effective portion being a portion of the second solar cell other than a portion of the second solar cell overlapping the second side of the third solar cell, the third effective portion being a portion of the third solar cell other than a portion of the third solar cell overlapping the first side of the second solar cell. A ratio of the second width of the second solar cell in the second direction to the first width of the first solar cell in the second direction is between 1.018 and 1.055, and wherein a ratio of the second width of the second solar cell in the second direction to the third width of the third solar cell in the second direction is between 1.036 and 1.105. A ratio of a width of at least one of the plurality of solar cells in the second direction to a length of the at least one of the plurality of solar cells in the first direction is between 2.5 and 12.5.

In general, another innovative aspect of the subject matter described in this specification can be implemented in a solar cell panel comprising: a plurality of solar cells, the plurality of solar cells having respective lengths in a first direction and respective widths in a second direction; and one or more connecting members that electrically connect two adjacent solar cells of the plurality of solar cells, wherein the plurality of solar cells includes: a first solar cell including an inclined portion, and a second solar cell including a non-inclined portion, and wherein a first width of the first solar cell in the second direction is different from a second width of the second solar cell in the second direction.

The foregoing and other implementations can each optionally include one or more of the following features, alone or in combination. In particular, one implementation includes all the following features in combination. The second solar cell has a rectangular shape, and the second width of the second solar cell in the second direction is smaller than the first width of the first solar cell in the second direction.

According to the implementation, photoelectric conversion areas can be substantially the same and the same amount of current flows in solar cells having different shapes, and thus, an amount of lost current can be minimized. Thus, output of a solar cell panel can be improved.

DETAILED DESCRIPTION

Figure 1:
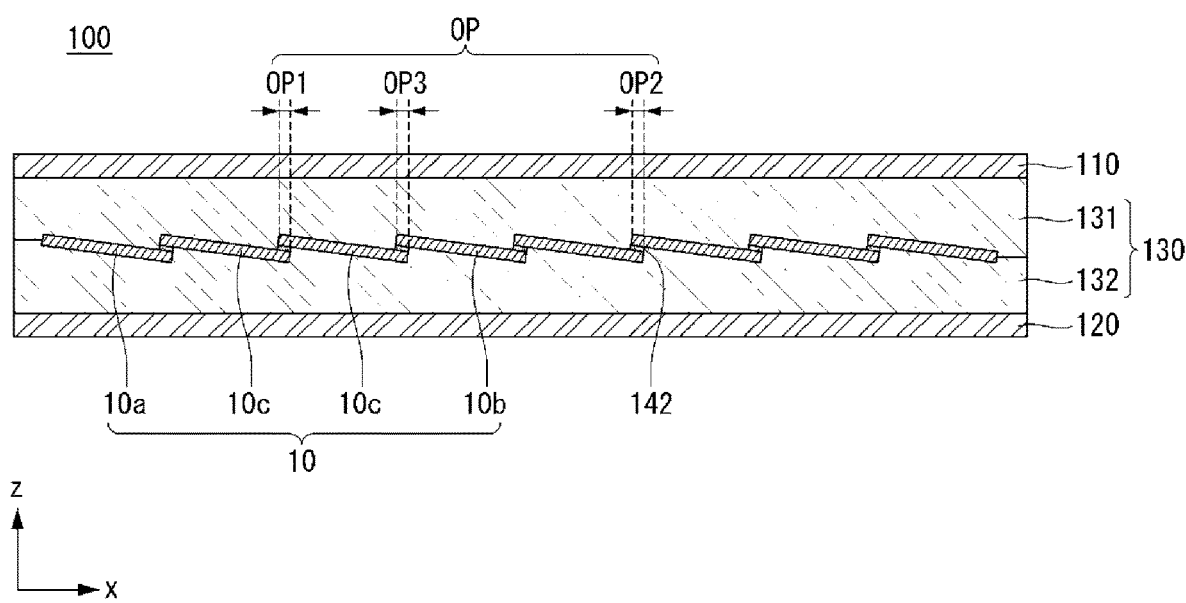
FIG. 1 is a cross-sectional view showing a solar cell panel according to an implementation of the invention.

Reference will now be made in detail to various implementations of the invention, examples of which are illustrated in accompanying drawings. The invention may, however, be embodied in many alternate forms and should not be construed as limited to the implementations set forth herein.

In the drawings, illustration of parts unrelated to implementations of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell panel according to an implementation of the invention will be described in detail with reference to the accompanying drawings.

Figure 2:
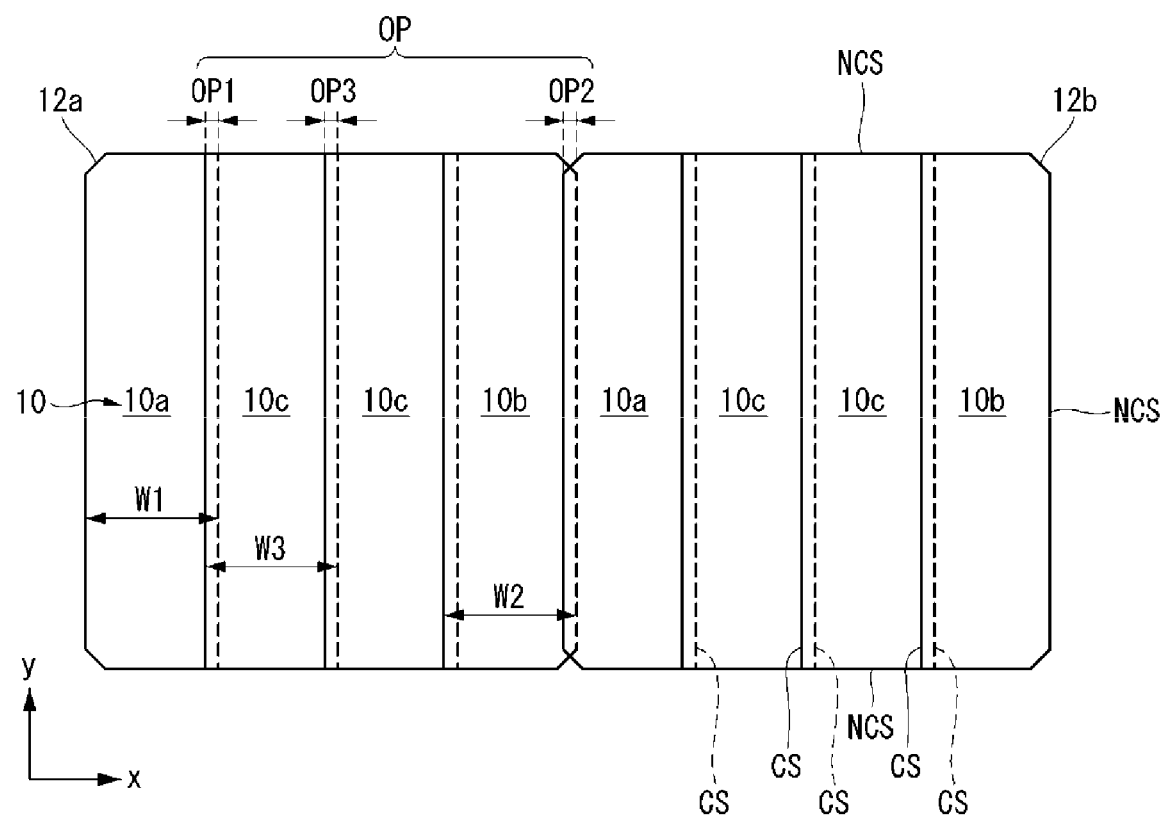
FIG. 2 is a plan view schematically showing a plurality of solar cells connected to each other by connecting members, wherein the plurality of solar cells and the connecting members are included in the solar cell panel shown in FIG. 1.

FIG. 1 is a cross-sectional view showing a solar cell panel 100 according to an implementation of the invention, and FIG. 2 is a plan view schematically showing a plurality of solar cells 10 connected to each other by connecting members 142, wherein the plurality of solar cells 10 and the connecting members 142 are included in the solar cell panel 100 shown in FIG. 1. In FIG. 2, a front electrode 42, a back electrode 44, and a connecting member 142 are not shown for clarity and simplicity.

Referring to FIGS. 1 and 2, a solar cell panel 100 according to an implementation includes a plurality of solar cells 10, each having a major axis (a long axis) and a minor axis (a short axis), and a connecting member 142 for electrically connecting the plurality of solar cells 10. In this instance, the plurality of solar cells 10 includes a first solar cell 10a having a first inclined portion 12a at one side thereof and a second solar cell 10b having a second inclined portion 12b at the other side thereof, and may include a third solar cell 10c not having an inclined portion 12a or 12b. In the implementation, the first solar cell 10a and the second solar cell 10b may have an asymmetric shape. For example, a first width W1 of the first solar cell 10a is different from a second width W2 of the second solar cell 10b. In this instance, one side and the other side may be determined with respect to a direction parallel to the minor axis of the solar cell 10 or a longitudinal direction of a solar cell string. This will be described in more detail later.

The solar cell panel 100 may include a sealing member 130 that surrounds and seals the plurality of solar cells 10 and the connecting member 142, a first cover member 110 that is positioned on a surface of the solar cell 10 on the sealing member 130, and a second cover member 120 that is positioned on the other surface of the solar cell 10 on the sealing member 130.

The first cover member 110 is disposed on the sealing member 130 (for example, a first sealing member 131) to constitute a surface (for example, a front surface) of the solar cell panel 100, and the second cover member 120 is disposed on the sealing member 130 (for example, a second sealing member 132) to constitute the other surface (for example, a back surface) of the solar cell panel 100. Each of the first cover member 110 and the second cover member 120 may be formed of an insulating material capable of protecting the solar cell 10 from external shock, moisture, ultraviolet rays, or the like. The first cover member 110 may be formed of a light-transmitting material that can transmit light, and the second cover member 120 may be formed of a sheet of a light-transmitting material, a non-light-transmitting material, or a reflective material. For example, the first cover member 110 may be formed of a glass substrate having excellent durability and an excellent insulation property, and the second cover member 120 may be formed of a film or a sheet. The second cover member 120 may have a TPT (Tedlar/PET/Tedlar) type or may include a base film (for example, a polyethylene-terephthalate (PET) film) and a polyvinylidene fluoride (PVDF) resin layer formed on at least one surface of the base film.

The sealing member 130 may include the first sealing member 131 positioned on the front surface of the solar cells 10 connected by the connecting member 142 and the second sealing member 131 positioned on the back surface of the solar cells 10 connected by the connecting member 142. The first sealing member 131 and the second sealing member 132 prevent moisture and oxygen from entering and chemically couple members of the solar cell panel 100. Each of the first and second sealing members 131 and 132 may be formed of an insulating material having a light-transmitting property and an adhesive property. For example, an ethylene-vinyl acetate copolymer resin (EVA), a polyvinyl butyral, a silicone resin, an ester-based resin, an olefin-based resin, or the like may be used for the first sealing member 131 or the second sealing member 132. The second cover member 120, the second sealing member 132, the plurality of solar cells 10 connected by the connecting members 142, the first sealing member 132, and the second sealing member 132 are integrated by a lamination process using the first and second sealing members 131 and 132 to form the solar cell panel 100.

However, implementations of the invention are not limited thereto. Accordingly, the first and second sealing members 131 and 132, the first cover member 110, or the second cover member 120 may include any of various materials other than those described above, and may have any of various shapes. For example, the first cover member 110 or the second cover member 120 may have any of various forms (e.g., a substrate, film, sheet, etc.) or material.

In the implementation, two adjacent solar cells 10 of the plurality of solar cells 10 are overlapped with each other to form an overlapped portion OP, and the connecting member 142 is positioned between the two adjacent solar cells 10 in the overlapped portion OP, and thus, the two adjacent solar cells 10 are electrically connected. The plurality of solar cells 10 may be electrically connected in series, parallel, or series-parallel by the connecting member 142. For example, a plurality of solar cells 10 may be sequentially connected in series by connecting members 142 to constitute a solar cell string forming one row. In this instance, the plurality of solar cells 10 connected by the connecting members 142 may be manufactured to have a major axis and a minor axis by cutting a mother solar cell.

The solar cell 10 and the connecting member 142 will be described in more detail with reference to FIGS. 3 and 4 together with FIGS. 1 and 2. More particularly, a structure of each solar cell 10 will be described with reference to FIG. 3, and then, a connection structure between two adjacent solar cells 10 using the connecting member 142 will be described in more detail with reference to FIGS. 1 to 4.

Figure 3:
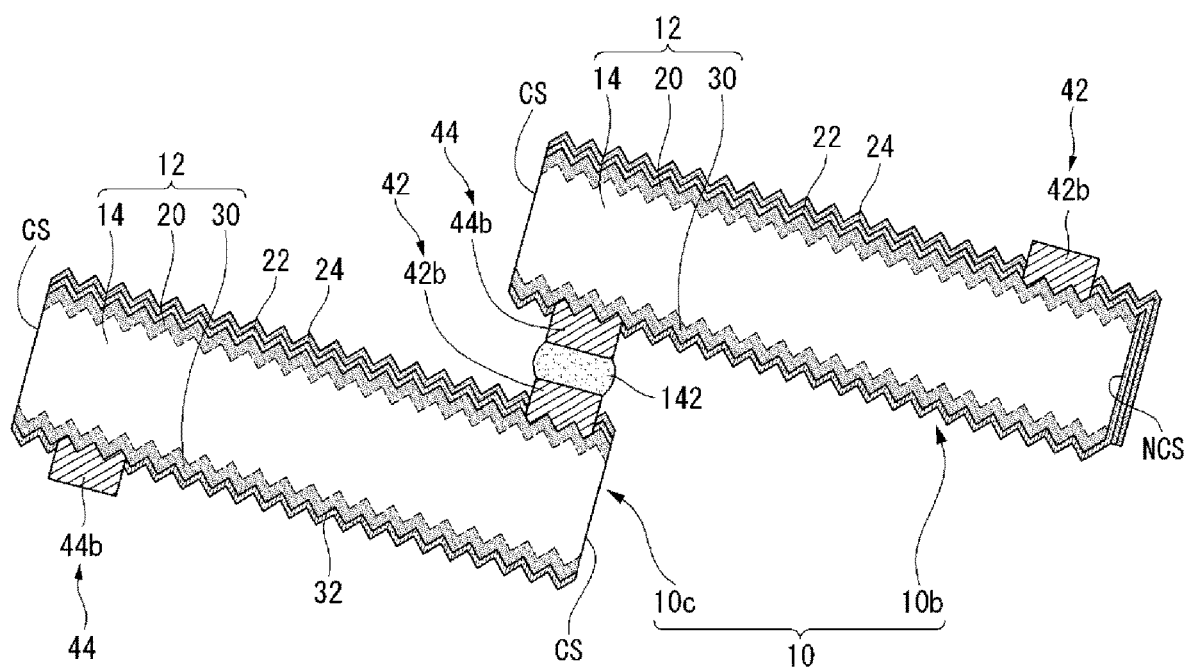
FIG. 3 is a cross-sectional view schematically showing two solar cells connected to each other by a connecting member, wherein the two solar cells and the connecting member are included in the solar cell panel shown in FIG. 1.

FIG. 3 is a cross-sectional view schematically showing two solar cells 10 (for example, a third solar cell 10c and a second solar cell 10b) connected to each other by a connecting member 142, wherein the two solar cells 10 and the connecting member 142 are included in the solar cell panel 100 shown in FIG. 1. FIG. 4 is a front plan view and a rear plan view showing the third solar cell 10c included in the solar cell panel 100 shown in FIG. 1. For clarity and simplicity, the connecting member 142 is not shown in FIG. 4, a front surface of a semiconductor substrate 12, and a first conductive region 20 and a front electrode 42 thereon in the third solar cell 10c are shown FIG. 4(a), and a back surface of the semiconductor substrate 12, and a second conductive region 30 and a back electrode 44 thereon in the third solar cell 10c are shown FIG. 4(b).

Figure 4:
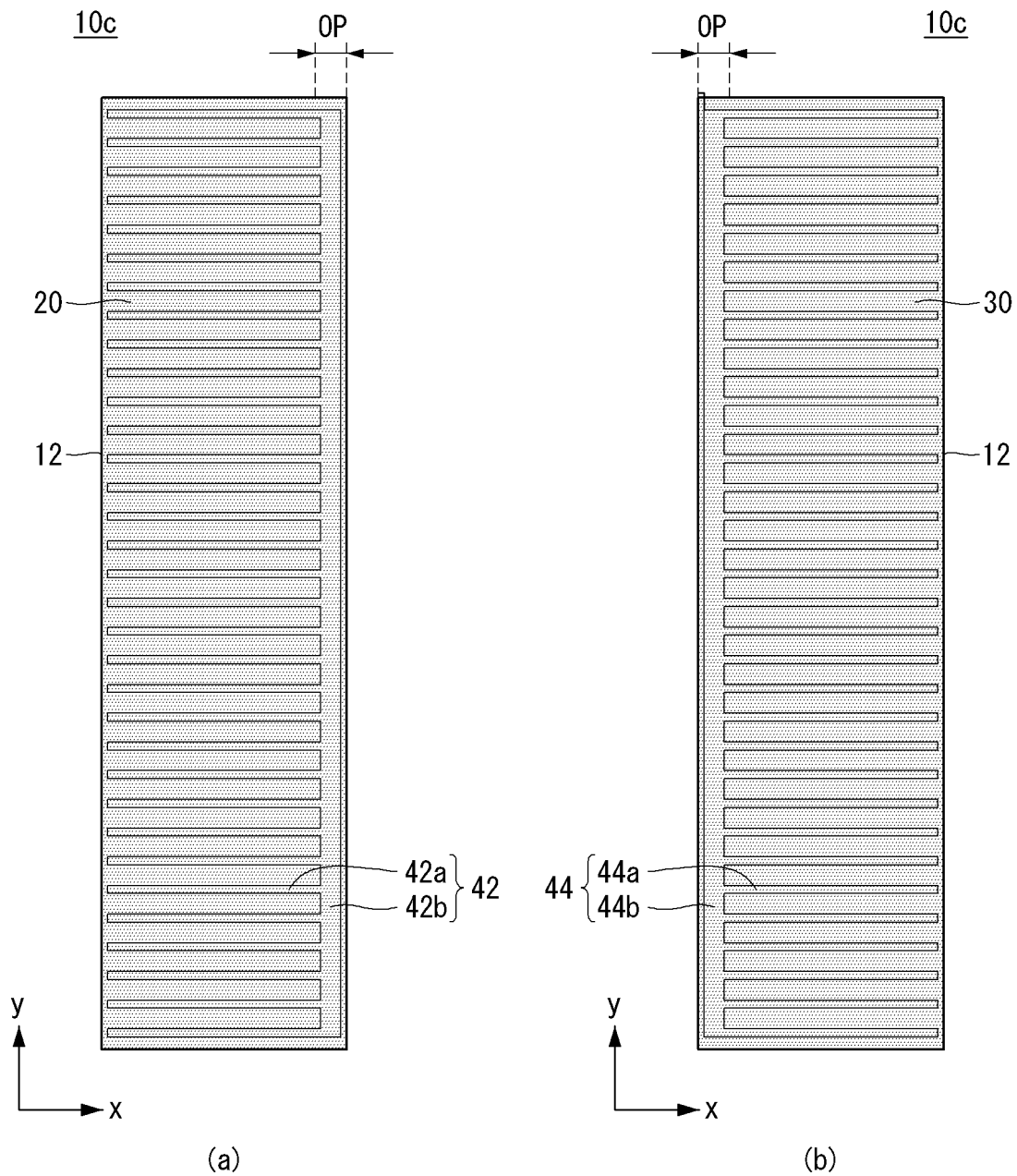
FIG. 4 is a front plan view and a rear plan view showing a third solar cell included in the solar cell panel shown in FIG. 1.

In this instance, to simply and clearly show and explain the implementation, a third solar cell 10c and a second solar cell 10b are shown in FIG. 3, and the third solar cell 10c is shown in FIG. 4. Contents of structures of the third solar cell 10c and/or the second solar cell 10b may be applied to all of the first to third solar cells 10a, 10b, and 10c, if there is no other description. Also, a connection structure of the third solar cell 10c and the second solar cell 10b may be applied to a connection structure of the first solar cell 10a and the third solar cell 10c and a connection structure of the second solar cell 10b and the first solar cell 10a as it is.

Hereinafter, a structure of each solar cell 10 (that is, a structure of the first solar cell 10a, a structure of the second solar cell 10b, a structure of the third solar cell 10c) will be described referring to the third solar cell 10c and/or the second solar cell 10b shown in FIG. 3, and then, a connection structure of two adjacent solar cells 10 using the connecting member 142 will be described in more detail referring to FIGS. 1 and 4.

Referring to FIG. 3, a solar cell 10 according to the implementation includes a semiconductor substrate 12, a conductive region 20 or 30 formed at or on the semiconductor substrate 12, and an electrode 42 or 44 connected to the conductive region 20 or 30. That is, the solar cell 10 according to the implementation may be a crystalline solar cell based on the semiconductor substrate 12. For example, the conductive region 20 or 30 may include a first conductive region 20 and a second conductive region 30 having different conductivity types, and the electrode 42 or 44 may include a front electrode 42 connected to the first conductive region 20 and a back electrode 44 connected to the second conductive region 30.

The semiconductor substrate 12 may include a base region 14 including a first or second conductivity type dopant to have a first or second conductivity type at a relatively low doping concentration. In one example, the base region 14 may have a second conductivity type. The base region 14 may be formed of a single-material crystalline semiconductor (e.g., a single-material single-crystalline or polycrystalline semiconductor, such as, single-crystalline or polycrystalline silicon, more particularly, single-crystalline silicon) including a first or second conductivity type dopant. The solar cell 10 based on the base region 14 or the semiconductor substrate 12 having a high degree of crystallinity and having few defects is excellent in electrical property. In this instance, at least one of the front surface and the back surface of the semiconductor substrate 12 may be provided with a texturing structure or an anti-reflection structure having a concavo-convex shape or an uneven shape such as a pyramid to minimize reflection.

The conductive region 20 or 30 may include the first conductive region 20 having the first conductivity type and positioned on one surface (for example, a front surface) of the semiconductor substrate 12, and the second conductive region 30 having the second conductivity type and positioned on the other surface (e.g., the back surface) of the semiconductor substrate 12. The conductive regions 20 and 30 may have a conductivity type different than that of the base region 14 or may have a higher doping concentration than the base region 14. In the implementation, the first and second conductive regions 20 and 30 are formed of a doped region constituting a part of the semiconductor substrate 12, and thus, a junction property with the base region 14 can be improved. In this instance, the first conductive region 20 or the second conductive region 30 may have a homogeneous structure, a selective structure, or a local structure.

However, implementations of the invention are not limited thereto, and at least one of the first and second conductive regions 20 and 30 may be formed separately from the semiconductor substrate 12 on the semiconductor substrate 12. In this instance, the first or second conductive region 20 or 30 may be formed of a semiconductor layer (for example, an amorphous semiconductor layer, a microcrystalline semiconductor layer, or a polycrystalline semiconductor layer, for example, an amorphous silicon layer, a microcrystalline silicon layer, or a polycrystalline silicon layer) having a crystal structure different from that of the semiconductor substrate 12. Then, the first or second conductive region 20 or 30 can be easily formed on the semiconductor substrate 12.

One of the first and second conductive regions 20 and 30, which has a conductivity type different from that of the base region 14, constitutes at least a part of an emitter region. The other one of the first and second conductive regions 20 and 30, which has a conductivity type the same as that of the base region 14, constitutes at least a part of a surface field region. For example, in the implementation, the base region 14 and the second conductive region 30 may have an n-type as the second conductivity type, and the first conductive region 20 may have a p-type. Then, the base region 14 and the first conductive region 20 form a pn junction. When light is incident to the pn junction, electrons generated by a photoelectric effect move toward the back surface of the semiconductor substrate 12 and are collected by the back electrode 44, and holes move toward the front surface of the semiconductor substrate 12 and are collected by the front electrode 42, thereby generating electric energy. Then, holes having a slower moving speed than electrons may move to the front surface of the semiconductor substrate 12, not the back surface thereof, thereby improving efficiency. However, implementations of the invention are not limited thereto. Thus, the base region 14 and the second conductive region 30 may have a p-type and the first conductive region 20 may have an n-type. Also, the base region 14 may have the conductivity type the same as that of the first conductive region 20 and opposite to that of the second conductive region 30.

In this instance, as the first or second conductivity type dopant, any of various materials which represent n-type or p-type may be used. As the p-type dopant, a group III element such as boron (B), aluminum (Al), gallium (Ga), or indium (In) may be used. As the n-type, a group V element such as phosphorus (P), arsenic (As), bismuth (Bi), or antimony (Sb) may be used. For example, the p-type dopant may be boron (B) and the n-type dopant may be phosphorus (P).

A first passivation layer 22 and/or an anti-reflection layer 24, which is a first insulating layer, may be formed on (e.g., in contact with) the front surface of the semiconductor substrate 12 (more particularly, the first conductive region 20 formed at the front surface of the semiconductor substrate 12). A second passivation layer 32, which is a second insulating layer, may be formed on (e.g., in contact with) the back surface of the semiconductor substrate 12 (more particularly, the second conductive region 30 formed at the back surface of the semiconductor substrate 12). The first passivation layer 22, the anti-reflection layer 24, and the second passivation layer 32 may be formed of any of various insulating materials. For example, the first passivation layer 22, the anti-reflection layer 24, or the second passivation layer 32 may be formed of a single layer or have a multi-layered structure in which two or more layer are included. The single layer or the multi-layered structure may include at least one of a silicon nitride film, a silicon nitride film including hydrogen, a silicon oxide film, a silicon oxynitride film, an aluminum oxide film, a silicon carbide film, ZnS, $TiO_2$, and $CeO_2$. However, implementations of the invention are not limited thereto.

The front electrode 42 is electrically connected to (e.g., in direct contact with) the first conductive region 20 through an opening passing through the first insulating layer and the back electrode 44 is electrically connected (e.g., in direct contact with) to the second conductive region 30 through an opening passing through the second insulating layer. The front and back electrodes 42 and 44 are formed of any of various conductive materials (e.g., a metal) and may have any of various shapes.

For example, referring to FIGS. 3 and 4, the front electrode 42 may include a plurality of finger electrodes 42a spaced apart from each other with a predetermined pitch. In FIG. 4, it is exemplified that the finger electrodes 42a extend in a direction of the minor axis, are parallel to each other, and are parallel to one edge of the semiconductor substrate 12.

The front electrode 42 may include a bus bar electrode 42b extending in a direction of the major axis (a y-axis direction in the drawing) crossing (for example, perpendicular to) the direction of the minor axis and connecting ends of the finger electrodes 42a. The bus bar electrode 42b is positioned in the overlapped portion OP. The overlapped portion OP is a portion overlapping another solar cell 10 and is a portion where the connecting member 142 connecting two adjacent solar cells 10 is directly positioned. In this instance, a width of the bus bar electrode 42b may be greater than a width of the finger electrode 42a, but implementations of the invention are not limited thereto. Therefore, the width of the bus bar electrode 42b may be equal to or less than the width of the finger electrode 42a. Also, the bus bar electrode 42b may be not positioned in the overlapped portion OP.

In a cross-sectional view, both of the finger electrode 42a and the bus bar electrode 42b of the front electrode 42 may be formed through the first insulating layer. However, implementations of the invention are not limited thereto. As another example, the finger electrode 42a of the front electrode 42 may be formed through the first insulating layer, and the bus bar electrode 42b may be formed on the first insulating layer.

Similarly, the back electrode 44 may include a plurality of finger electrodes 44a, and a bus bar electrode 44b connecting ends of the plurality of second electrodes 44a. The contents of the front electrode 42 may be applied to the back electrode 44 as it is and the content of the first insulating layer with respect to the front electrode 42 may be applied to the second insulating layer with respect to the back electrode 44 as it is, if there is no other description. The width and the pitch of the finger electrode 42a and the bus bar electrode 42b of the front electrode 42 may be the same as or different from the width and the pitch of the finger electrode 44a and the bus bar 44b of the back electrode 44.

In the implementation, one bus bar electrode 42b of the front electrode 42 is provided at a portion adjacent to the other side (a left side of FIG. 4) of the finger electrode 42a of the front electrode 42, and one bus bar electrode 44b of the back electrode 44 is provided at a portion adjacent to one side (a right side of FIG. 4) of the finger electrode 44a of the back electrode 44. More specifically, the bus bar electrode 42b of the front electrode 42 may extend along the direction of the major axis (the y-axis direction in the drawing) of the semiconductor substrate 12 at the portion adjacent to the other side of the semiconductor substrate 12 in the direction of the minor axis, and the bus bar electrode 44b of the back electrode 44 may extend along the direction of the major axis of the semiconductor substrate 12 at the portion adjacent to the one side of the semiconductor substrate 12 in the direction of the minor axis.

Then, when the solar cell 10 is connected, the bus bar electrode 42b of the front electrode 42 positioned at the other side of one solar cell 10 and the bus bar electrode 44b of the back electrode 44 positioned at the one side of the adjacent solar cell 10 are adjacent to each other at the overlapped portion OP, and thus, the two adjacent solar cells 10 can be stably connected by adhering them with the connecting member 142. In addition, the bus bar electrodes 42b and 44b may be formed only at one side on one surface, and thus, a material cost of the front and back electrodes 42 and 44 can be reduced and a manufacturing process for forming the front and back electrodes 42 and 44 can be simplified.

A connection electrode or a peripheral electrode which extends in a direction crossing a plurality of finger electrodes 42a and 44a and connects the plurality of finger electrodes 42a and 44a may be further included. For example, in the second solar cell 10b shown in FIG. 5, portions inclined to the finger electrode 42a at both sides of the bus bar electrode 42b in a direction of the major axis may be the peripheral electrode. The connection electrode or the peripheral electrode may have a width equal to or less than a width of the bus bar electrode 42b, and, more particularly, may have a width smaller than the width of the bus bar electrode 42b. Alternatively, the connecting electrode or the peripheral electrode may be positioned adjacent to a side opposite to the bus bar electrode 42b (that is, adjacent to the one side). The connection electrode or the peripheral electrode serves to provide a bypass path when there is a problem such as damage to some of the finger electrodes 42a and 42b or to connect some finger electrodes 42a and 44a not directly connected to the bus bar electrodes 42a and 44b due to the inclined portions to other finger electrodes 42a and 44a so that the some finger electrodes 42a and 44a are electrically connected to the bus bar electrodes 42a and 44b via the other finger electrodes 42a and 44a.

However, implementations of the invention are not limited thereto. Therefore, the bus bar electrode 42b or 44b may not be included, or electrodes having different shapes from those of the first and finger electrodes 42a and 44a may be formed. Also, unlike the above, planar shapes of the front electrode 42 and the back electrode 44 may be different from each other or may have no similarity, and various other modifications are possible.

As described above, in the implementation, a plurality of solar cells 10 having a cut surface CS may be formed by cutting a mother solar cell, and the cut solar cell 10 is used as a unit solar cell. In this instance, the cut surface CS may refer to a surface formed by cutting a mother solar cell after the mother solar cell is manufactured, and a non-cut surface NCS may be a surface having an original edge of a semiconductor substrate 12 or the mother solar cell. When the solar cell panel 100 is manufactured by connecting the plurality of solar cells 10 that are formed by cutting, output loss of the solar cell panel 100 (that is, cell to module loss (CTM loss)) can be reduced.

More particularly, the output loss of each solar cell 10 has a value obtained by multiplying a square of current by electric resistance, and the output loss of the solar cell panel 100 including the plurality of solar cells 10 has a total value obtained by multiplying the value, which is obtained by multiplying the square of the current by the electric resistance in each solar cell 10, by a number of solar cells 10. In this instance, in the current of each solar cell 10, there is a current generated by an area of the solar cell 10 itself. Thus, the current becomes greater when the area of the solar cell 10 increases, while the current becomes smaller when the area of the solar cell 10 decreases.

Therefore, when the solar cell panel 100 includes the solar cells 10 manufactured by cutting the mother solar cell, the current of each solar cell 10 decreases in proportion to the area, but the number of the solar cell 10 increases inversely. For example, when there are four solar cells 10 manufactured from the mother solar cell, the current in each solar cell 10 is reduced to one quarter of the current of the mother solar cell, and the number of solar cells 10 is four times the number of mother solar cell. The current is reflected as a square and the number is reflected as it is, and thus, the output loss is reduced to a quarter. Accordingly, the output loss of the solar cell panel 100 according to the implementation can be reduced.

In the implementation, a mother solar cell is manufactured as in the conventional manner, and then, the solar cell 10 is formed by cutting the mother solar cell. According to this, the solar cell 10 can be manufactured by manufacturing the mother solar cell using a used equipment and optimized design as it is, and then cutting the mother solar cell. As a result, a cost in equipment and process is minimized. On the other hand, if an area of a solar cell or a mother solar cell itself is reduced, it is burdened to replace an equipment or change a setting (for example, process conditions, etc).

More specifically, the mother solar cell or a semiconductor substrate thereof may be manufactured from a roughly circular ingot and may have a circular shape, a square shape, or a shape where lengths in two directions (x-axis and y-axis directions in the drawings) are the same or very similar. For example, the semiconductor substrate of the mother solar cell may have an octagonal shape having inclined portions 12a and 12b at four corner portions at an approximate square shape. With such a shape, the semiconductor substrate having a maximum area can be obtained from the same ingot. For reference, four solar cells 10, which are adjacent to each other in order from the left in FIG. 2, may be manufactured in one mother solar cell. However, implementations of the invention are not limited thereto, and the number of solar cells 10 manufactured from one mother solar cell may be variously modified.

As described above, the mother solar cell has a symmetrical shape and a maximum lateral width (a width across a center of the semiconductor substrate) and a maximum vertical width (a length across a center of the semiconductor substrate) in the mother solar cell are the same.

The solar cell 10 formed by cutting the mother solar cell along a cutting line extending in one direction (for example, the y-axis direction in the drawing) may have at least one cut surface CS. In this instance, it is exemplified that the mother solar cell is cut so that the solar cell has a long cut surface CS in one direction and thus the solar cell 10 has a shape having the major axis and the minor axis and the cut surface CS is positioned at least one of side surfaces of the solar cell 10 extending in a direction parallel to the major axis. Then, the cutting can be performed more stably and the damage of the solar cell 10 in the cutting process can be minimized. However, implementations of the invention are not limited thereto.

In the implementation, one or two cut surfaces CS are included in each solar cell 10. More particularly, the cut surfaces CS may be positioned at both sides extending in a direction parallel to the major axis or the cut surface CS may be positioned at one of the both sides extending in the direction parallel to the major axis, according to a position of the corresponding solar cell 10 in the mother solar cell.

More specifically, in the first solar cell 10a, the cut surface CS is positioned only along a long edge at the other side in the minor axis (the right side of the drawing), and side surfaces corresponding edges other than the long edge at the other side are non-cut surfaces NCS. In the second solar cell 10b, the cut surface CS is positioned only along a long edge at the one side in the minor axis (the left side of the drawing), and side surfaces corresponding edges other than the long edge at the one side are non-cut surfaces NCS. In the third solar cell 10c, the cut surfaces CS are positioned along long edges at both sides in the minor axis (the left side and right side of the drawing), and side surfaces corresponding edges other than the long edges at both sides are non-cut surfaces NCS.

For reference, whether a surface is the cut surface CS or the non-cut surface NCS may be determined or known by a presence or absence of insulating layers 22, 24, and 32 positioned on the side surface, a difference in a stacking structure of the insulating layers 22, 24, and 32, a presence or absence and a position of the inclined portion 12a or 12a, a difference in surface roughness on a microscope, a difference in surface morphology, and the like.

For example, insulating layers 22, 24, and 32 extending from the front and/or back surface of the semiconductor substrate 12 may be positioned on the side surface of the non-cut surface NCS, while the insulating layers 22, 24, and 32 extending from the front surface and/or back surface of the semiconductor substrate 12 may not be positioned on the side surface of the cut surface CS. Although it is shown that an additional insulating layer is not formed on the side surface of the cut surface CS of the semiconductor substrate 12 in the drawing, a thermal oxide layer (not shown) may be formed on the side surface of the cut surface CS in a cutting process using heat or the like. Even when the thermal oxide layer is positioned on the side surface of the cut surface CS as described above, a stacked structure of the thermal oxide layer is different from a stacked structure of the insulating layers 22, 24 and 32, or at least one of the insulating layers 22, 24, and 32 includes a material different from the thermal oxide layer. When the solar cell 10 has the inclined portion 12a or 12b, along with the minor axis and the major axis, three surfaces along three edges extending the major axis and the minor axes and connected by the inclined portion 12a or 12b are cut surface NCS and one surface along one edge that is not connected to the inclined portion 12a or 12b is a cut surface CS. Also, cutting marks may remain at the cut surface CS in the cutting process. For example, when the cutting process is performed by a laser machining process, laser marks or melted traces by lasers may be left behind. If a laser machining process and a mechanical cutting process that applies physical impact are used together, a portion cut by the laser machining process and a portion cut by the mechanical cutting process may have different angles or may have different morphologies. Also, whether a surface is a cut surface CS or a non-cut surface NCS may be determined or known according to any of various other methods.

The manufactured plurality of solar cells 10 are electrically connected to each other by using the connecting member 142. In the implementation, for example, the overlapped portion OP in which two adjacent solar cells 10 overlap each other is provided, and the connecting member 142 is provided between two adjacent solar cells 10 to electrically and physically connect them.

The connecting member 142 may include an adhesive material. As the adhesive material, any of various materials capable of electrically and physically connecting the two solar cells 10 with an electrical conductivity and an adhesive property may be used. For example, the connecting member 142 may be formed of a conductive adhesive (e.g., an electrical conductive adhesive, ECA), a solder, or the like.

In the implementation, one side of the solar cell 10 of the plurality of solar cells 10 is overlapped with the other side of the solar cell 10 adjacent thereto to form the overlapped portion OP. The overlapped portion OP is extended along a longitudinal direction of the bus bar electrodes 42b and 44b or along a direction of the major axis of the solar cell 10. The connecting member 142 is positioned between the bus bar electrodes 42b and 44b of two adjacent solar cells 10 positioned in the overlapped portion OP so that two adjacent solar cells 10 are electrically connected. Then, the solar cells 10 having the minor axis and the major axis can be connected in the direction of the major axis, and a connection area can be sufficiently secured to stably connect the solar cells 10. However, implementations of the invention are not limited thereto. Therefore, the connecting member 142 may be connected to the finger electrodes 42a and 44a instead of the bus bar electrodes 42b and 44b to electrically connect the solar cells 10. Various other variations are possible.

The connection structure of the two adjacent solar cells 10 may be successively repeated in two adjacent solar cells 10 to form a solar cell string of a plurality of solar cells 10. Such a solar cell string may be formed by any of various methods or apparatuses. The first cover member 110, the first sealing member 131, the plurality of solar cells 10 connected by the connecting members 142 (i.e., a solar cell string), the second sealing member 132, and the second cover member 120 are sequentially stacked to form a laminate structure, and a lamination process of applying heat and pressure to the laminate structure is performed to manufacture the solar cell panel 100.

In this instance, in the implementation, the first solar cell 10a, the second solar cell 10b, and the third solar cell 10c, which are different in presence or absence of the inclined portion 12a or 12b, position of the cut surface CS, position of the bus bar electrode 42a or 42b as described above. Thus, a shape and an area (e.g., a width) of the first to third solar cells 10a, 10b, and 10c are adjusted in consideration of this in the implementation. This will be described in more detail with reference to FIG. 5, along with FIG. 2.

Figure 5:
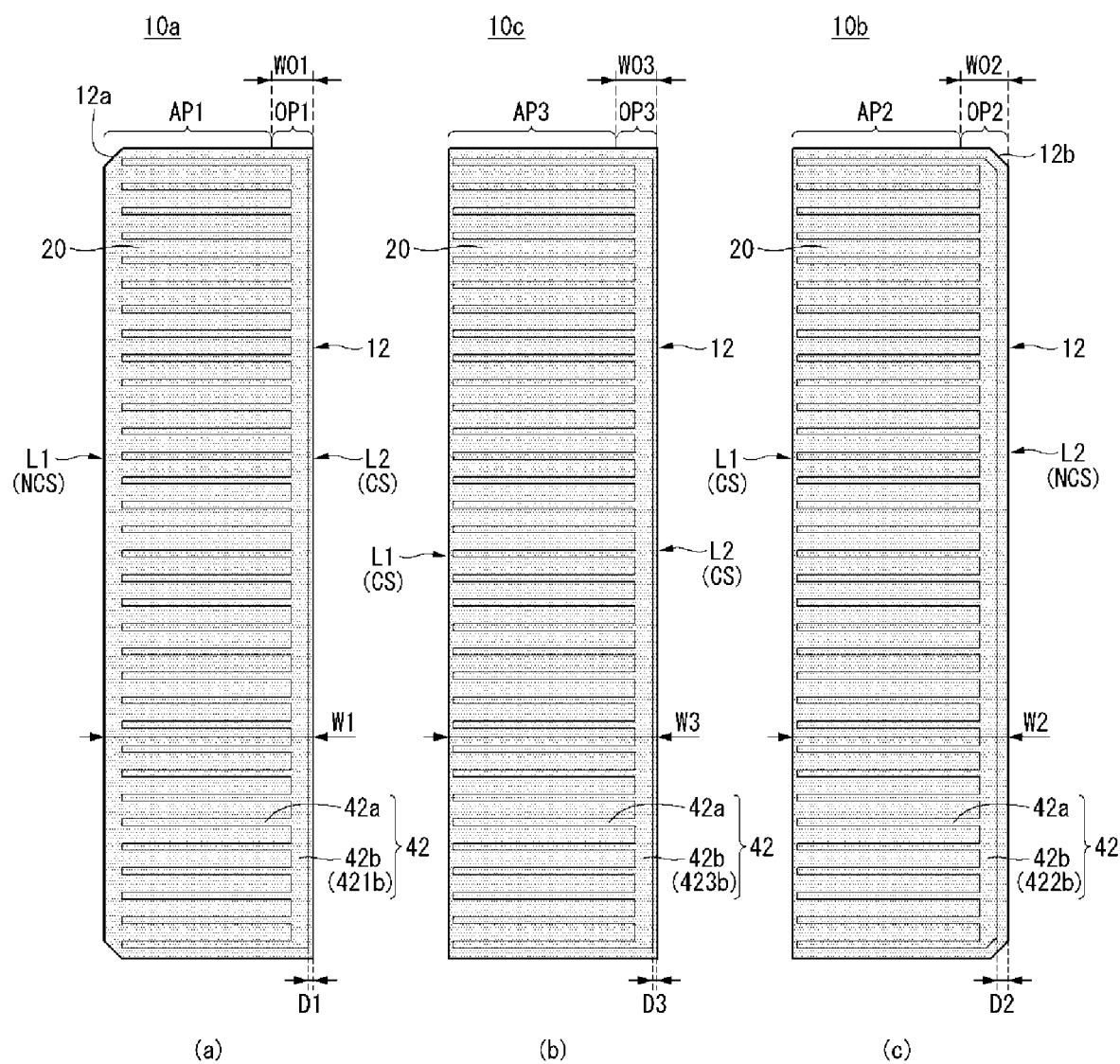
FIG. 5 is front plan views showing first to third solar cells included in the solar cell panel shown in FIG. 1, respectively.

FIG. 5 is front plan views showing the first to third solar cells 10a, 10b, and 10c included in the solar cell panel 100 shown in FIG. 1, respectively. More particularly, FIG. 5(a) is a front plan view of the first solar cell 10a, FIG. 5(b) is a front plan view of the third solar cell 10c, and FIG. 5(c) is a front plan view of the second solar cell 10b.

Referring to FIGS. 2 and 5, in the implementation, the first solar cell 10a having the first inclined portion 12a at the one side (the left side of the drawings) and the second solar cell 10b having the inclined portion 12b at the other side (the right side of the drawings) may have an asymmetrical shape with respect to each other. In this instance, the photoelectric conversion portion 12 or the semiconductor substrate 12 of the first solar cell 10a has an asymmetrical shape with respect to the photoelectric conversion portion 12 or the semiconductor substrate 12 of the second solar cell 10b, while the electrodes 42 and 44 of the first solar cell 10a and the electrodes 42 and 44 of the second solar cell 10b may have the same shape or structure. Particularly, the front electrode 42 of the first solar cell 10a and the front electrode 42 of the second solar cell 10b, which are positioned on the front surface where a relatively large amount of light is incident, may have the same shape or structure. In this instance, the term of "the same shape or structure" may mean a case that all of a width, a pitch, a length, etc. are all the same. Also, the term of "the same shape or structure" may also mean a case that the electrodes have the same arrangement or shape (for example, an arrangement of shape including the finger electrodes 42a and the bus bar electrode 42b) even though there is a difference in width, pitch, length, etc. are.

The third solar cell 10c may have a rectangular shape without the first and second inclined portions 12a and 12b. Accordingly, the third solar cell 10c may have a different shape from those of the first and second solar cells 10a and 10b. More specifically, the photoelectric conversion portion 12 or the semiconductor substrate 12 of the third solar cell 10c may have a different shape from the photoelectric conversion portions 12 or the semiconductor substrates 12 of the first and second solar cells 10a and 10b, while the electrodes 42 and 44 of the third solar cell 10c and the electrodes 42 and 44 of the first and second solar cells 10a and 10b may have the same shape or structure. Particularly, the front electrode 42 of the third solar cell 10c and the front electrodes 42 of the first and second solar cells 10a and 10b, which are positioned on the front surface where a relatively large amount of light is incident, may have the same shape or structure.

More specifically, a first width W1 of the first solar cell 10a having the first inclined portion 12a at one side thereof is different from a second width W2 of the second solar cell 10b having the second inclined portion 12b at the other side thereof. Also, the third width W3 of the third solar cell 10c may be different from the first width W1 and the second width W2 of the first and second solar cells 10a and 10b.

More specifically, the first width W1 of the first solar cell 10a may be smaller than the second width W2 of the second solar cell 10b. Also, the third width W3 of the third solar cell 10c may be smaller than both of the first width W1 and the second width W2. This is for making photoelectric conversion portions in the first and second solar cells 10a and 10b have the same or similar areas, considering the positions of the inclined portions 12a and 12b, the positions of first and second bus bar electrodes 421b and 422b in the first and second solar cells 10a and 10b, respectively. This will be explained in more detail.

In the first solar cell 10a in which the first inclined portion 12a is positioned at the one side, a first bus bar electrode 421b or the connecting member 142 positioned on one surface (i.e., the front surface) is positioned adjacent to a second edge L2, not a first edge L1 where the inclined portion 12a is positioned. In this specification, the first edge L1 refers to a long edge positioned at the one side (the left side of the drawing) in the direction of the minor axis, and the second edge L2 refers to a long edge positioned at the other side (the right side of the drawing) in the direction of the minor axis. In this instance, the first inclined portions 12a may be formed at both sides of the first edge L1 positioned at the one side.

The first edge L1 of the first solar cell 10a is an edge formed of the non-cut surface NCS, that is, an edge formed at the time of manufacturing the semiconductor substrate 12, while the second edge L2 of the first solar cell 10a is an edge formed of the cut surface CS, that is, an edge formed by cutting. That is, in the first solar cell 10a, the first bus bar electrode 421b is adjacent to the second edge L2 opposite to the first edge L1 where the first inclined portion 12a is positioned.

On the other hand, in the second solar cell 10b in which the second inclined portion 12b is positioned on the other side, the second bus bar electrode 422b positioned on one surface (i.e., the front surface) is adjacent to the second edge L2 where the second inclined portion 12b is positioned. In this instance, the second inclined portions 12b may be formed at both sides of the second edge L2 positioned at the other side.

The first edge L1 of the second solar cell 10b is an edge formed of the cut surface CS, that is, an edge formed by cutting, while the second edge L2 is an edge formed of the non-cut surface NCS, that is, an edge formed at the time of manufacturing the semiconductor substrate 12. That is, in the second solar cell 10b, the second bus bar electrode 422b is adjacent to the second edge L2 that is the edge of the non-cut surface NCS and where the second inclined portion 12a is positioned. In this instance, the second inclined portions 12b may be formed at both sides of the first edge L2 in the major axis at the other side in the minor axis.

In the third solar cell 10c in which the first and second inclined portions 12a and 12b are not provided, a third bus bar electrode 423b positioned on one surface (i.e., the front surface) is adjacent to the second edge L2. In the third solar cell 10c, first and second edges L1 and L2 are edges formed of cut surfaces CS formed by cutting, respectively. That is, in the third solar cell 10b, the third bus bar electrode 423b is adjacent to the second edge L2, which is the edge of the cut surface CS.

The first to third bus bar electrodes 421b, 422b, 423b positioned in the first to third solar cells 10a, 10b, and 10c are adjacent the second edges L2 of the first to third solar cells 10, 10b, and 10c, respectively. In this way, the mother solar cells are cut to form a plurality of solar cells 10, and the plurality of solar cells 10 can be connected as they are without being rotated. Accordingly, a manufacturing process of the solar cell panel 100 can be simplified.

However, the first to third solar cells 10a, 10b and 10c are difference in presence or absence of the inclined portions 12a and 12b, positions of the inclined portions 12a and 12b, and positions of the cut surface CS and non-cut surface NCS. Thus, the positions of the first to third bus bar electrodes 421b, 422b, and 423b may be different from each other even if they are adjacent to the second edge L2.

That is, a distance between the bus bar electrode 42b and the adjacent edge when the bus bar electrode 42b is adjacent to the edge of the non-cut surface NCS may be different from a distance between the bus bar electrode 42b and the adjacent edge when the bus bar electrode 42b is adjacent to the edge of the cut surface CS. For example, the bus bar electrode 42b may be positioned closer to the edge of the cut surface CS than the edge of the non-cut surface NCS. When the bus bar electrode 42b is adjacent to the edge of the non-cut surface NCS, the distance to the edge may be relatively large in order to prevent undesired shunts and the like. On the other hand, when the bus bar electrode 42b is adjacent to the edge of the cut surface CS, the distance to the edge may be relatively small only considering tolerance. Particularly, the electrodes 42 and 44 are formed so as to be spaced apart from each other to have a space therebetween to correspond to the plurality of solar cells 10 in the mother solar cell, and a center of the space between the electrodes 42 and 44 is cut to manufacture a plurality of solar cells 10 in a cutting process. Thus, the distance between the electrodes 42 and 44 and the edge of the cut surface CS is half the distance between the electrodes 42 and 44 in the mother solar cell. Accordingly, the distance between the cut surface CS and the electrodes 42 and 44 may have a relatively smaller value.

That is, a first distance D1 between the second edge L2 of the cut surface CS in the first solar cell 10a and the first electrode (e.g., the first bus bar electrode 421b) of the first solar cell 10a adjacent thereto may be different from a second distance D2 between the second edge L2 of the non-cut surface NCS in the second solar cell 10b and the second electrode (for example, the second bus bar electrode 422b) of the second solar cell 10b adjacent thereto. As an example, the first distance D1 may be smaller than the second distance D2.

In order to connect a solar cell 10 to a neighboring solar cell 10, the overlapped portion OP has a width including a certain tolerance along with a width of the first or second bus bar electrode 421b or 422b. In this instance, since the first distance D1 is smaller than the second distance D2, a width WO1 of the first overlapped portion OP1 of the first solar cell 10a may be the same as or smaller than a width WO2 of the second overlapped portion OP2 of the second solar cell 10b. In particular, the width WO1 of the first overlapped portion OP1 may be smaller than the width WO2 of the second overlapped portion OP2. In this specification, positions of the first to third overlapped portions OP1, OP2 and OP3 and widths of the first to third overlapped portions OP1, OP2 and OP3 may be defined based on a portion of the solar cell 10, which is covered by the neighboring solar cell 10, on the front surface of the solar cell 10 where relatively large amount of light is incident. That is, the first overlapped portion OP1 and the width WO1 thereof are defined as a portion of the first solar cell 10a where the third solar cell 10c positioned thereon to be overlapped with the first solar cell 10a and the width thereof, respectively. The second overlapped portion OP2 and the width WO2 thereof are defined as a portion of the second solar cell 10b where the first solar cell 10a positioned thereon to be overlapped with the second solar cell 10b and a width thereof, respectively. A third overlapped portion OP3 and a width WO3 thereof may be defined as a portion of the third solar cell 10c where the second solar cell 10b or another third solar cell 10c positioned thereon to be overlapped with the third solar cell 10b and a width thereof, respectively.

A portion of the first solar cell 10a other than the first overlapped portion OP1 may be referred to as a first effective portion AP1, a portion of the second solar cell 10b other than the second overlapped portion OP2 may be referred to as a second effective portion AP2, and a portion of the third solar cell 10c other than the third overlapped portion OP3 may be referred to as a third effective portion AP3. In this instance, the first inclined portion 12a is positioned in the first effective portion AP1, but the second inclined portion 12b is not positioned in the second effective portion AP2. Thus, if the first effective portion AP1 and the second effective portion AP2 have the same width, an area of the first effective portion AP1 may be smaller than an area of the second effective portion AP2.

Thus, in the implementation, in order to make areas of the first effective portion AP1 of the first solar cell 10a and the second effective portion AP2 of the second solar cell 10b, which contribute to the photoelectric conversion, the same or similar, a width of the second effective portion AP2 may be smaller than a width of the first effective portion AP1. That is, in order to make the area of the first effective portion AP1 having the first inclined portion 12a the same as the area of the second effective portion AP2 not having an inclined portion, the width of the second effective portion AP2 may be smaller than the width of the first effective portion AP1. On the other hand, as described above, the second distance D2 is larger than the first distance D1, and thus, a width of the second overlapped portion OP2 may be larger than a width of the first overlapped portion OP1. In this instance, the first inclined portion 12a has a relatively small area at both side end portions in the major axis direction, while the second distance D2 is relatively greater than the first distance D1 to ensure stability with the non-cut surface NCS. Therefore, a difference between the first distance D1 and the second distance D2 (i.e., a value obtained by subtracting the first distance D1 from the second distance D2) is larger than a difference between the width of the first effective portion AP1 and the second effective portion AP2 for securing the area corresponding to the first inclined portion 12a (i.e., a value obtained by subtracting the width of the second effective portion AP2 from the width of the first effective portion AP1). Accordingly, compared with the first solar cell 10a, the second solar cell 10b has the second effective portion AP2 having a smaller width with a relatively small difference than the first effective portion AP1 and has the second overlapped portion OP2 having a larger width with a relatively large difference than the first overlapped portion OP1. That is, the second width W2 of the second solar cell 10b in the direction of the minor axis is greater than the first width W1 of the first solar cell 10a. Then, the areas of the first and second effective portions AP1 and AP2 can be the same as or similar to each other, and stability of the second solar cell 10b including the second overlapped portion OP2 at a region adjacent to the non-cut surface NCS can be greatly improved.

The third solar cell 10c differs from the first solar cell 10a in that it does not include the inclined portions 12a and 12b. The third solar cell 10c differs from the second solar cell 10b in that it does not include the inclined portions 12a and 12b and the third bus bar electrode 423b is adjacent to the second edge L2 of the cut surface CS. That is, a third distance D3 between the second edge L2 of the third solar cell 10c and a third electrode (e.g., the third bus bar electrode 423b) of the third solar cell 10c adjacent to the second edge L2 of the third solar cell 10c may be substantially the same as the first distance D1 and may be less than the second distance D2. Thus, a width WO3 of the third overlapped portion OP3 of the third solar cell 10c may be substantially the same as a width WO1 of the first overlapped portion OP1, and may be substantially the same as or less than a width WO2 of the second overlapped portion OP2. In particular, the width WO3 of the third overlapped portion OP3 may be smaller than the width WO2 of the second overlapped portion OP2.

That is, since the first solar cell 10a has the first inclined portion 12a but the third solar cell 10c does not have the inclined portions 12a and 12b, the third width W3 may be smaller than the first width W1 so that an area of the third effective portion AP3 and an area of the first effective portion AP1 may be equal or similar to each other. Particularly, since the width WO3 of the third overlapped portion OP3 is substantially equal to the width WO1 of the first overlapped portion OP1, a width of the third effective portion AP3 (i.e., a value obtained by subtracting the width WO3 of the third overlapped portion OP3 from the third width W3) may be smaller than a width of the first effective portion AP1 (i.e., a value obtained by subtracting the width WO1 of the first overlapped portion OP1 from the first width W1). Also, the second solar cell 10b has the second inclined portion 12b but the third solar cell 10c does not have the inclined portions 12a and 12b and the third distance D3 is smaller than the second distance D2, the third width W3 may be smaller than the second width W2 so that an area of the third effective portion AP3 and an area of the second effective portion AP2 may be equal or similar to each other. For example, since the second overlapped portion OP2 and the third overlapped portion OP3 do not have the inclined portions 12 and 12b, the width of the third effective portion AP3 (i.e., the value obtained by subtracting the width WO3 of the third overlapped portion OP3 from the third width W3) may be the same as a width of the second effective portion AP2 (i.e., a value obtained by subtracting the width WO2 of the second overlapped portion OP1 from the second width W2).

For example, a ratio (W2/W1) of the second width W2 to the first width W1 may be in a range of 1.018 to 1.055, and a ratio (W2/W3) of the second width W2 to the third width W3 may be in a range of 1.036 to 1.105. In the implementation, three to twelve (for example, three to eight) solar cells 10 may be manufactured from one mother solar cell, and the cut solar cell 10 may be used. The above ratios are limited so that the areas of the effective portions AP1, AP2, and AP3 are the same or similar to each other. For example, a difference (W2−W1) between the second width W2 and the first width W1 may be the same as or greater than a difference (W1−W3) between the first width W1 and the third width W3. This is for making the areas of the effective portions AP1, AP2, and AP3 the same as or similar to each other, considering shapes of the first to third solar cells 10a, 10b, and 10c, positions of the inclined portions 12a and 12b and the bus bar electrode 42b, and the like. However, implementations of the invention are not limited thereto. The difference (W1−W3) between the second width W1 and the third width W3 may be greater than the difference (W2−W1) between the second width W2 and the first width W1.

That is, in the implementation, one first solar cell 10a, one second solar cell 10b, and one to ten (for example, one to six third solar cells 10c) may be manufactured from one mother solar cell. In this instance, if a number of solar cells 10 produced by cutting one mother solar cell is less than three (3), the effect of improving the output by the solar cells 10 having the minor axis and the major axis may not be sufficient. When the number of the solar cells 10 produced by cutting one mother solar cell is more than twelve (for example, more than eight), material cost due to the formation of the electrodes 42 and 44 is increased, or a problem of damage or defects of the solar cells 10 may occur because the widths of the solar cells 10 are excessively small. However, implementations of the invention are not limited thereto.

Each of the first to third solar cells 10a, 10b, and 10c may have a ratio of a length in the major axis to a width in the minor axis may be in a range of 2.5 to 12.5 (2.5 to 8.5). Since the first to third solar cells 10a, 10b, and 10c have different widths in the minor axis and there is a tolerance in a manufacturing process in the implementation, it can be regarded that three to twelve (for example, three to eight) solar cells 10 are produced from one mother solar cell when the ratio is within the above-mentioned range.

According to the implementation, photoelectric conversion areas can be substantially the same by designing shapes, widths, or so on of solar cells 10 considering positions of the inclined portion 12a or 12b and the electrodes 42 and 44 (in particular, the bus bar electrode 42b of the front electrode 42 positioned on the front surface or the overlapped portion OP at the front surface). Then, the same amount of current flows in the solar cells 10 having different shapes, and thus, the amount of lost current can be minimized. Thus, output of the solar cell panel 100 can be improved. Particularly, when the implementation is applied to the case that the first and second solar cells 10a and 10b in which the inclined 12a and 12b are positioned at the opposite side and the bus bar electrodes 42b of the front electrode 42 or the overlapped portions OP on the front surfaces are formed at the same side, the photoelectric conversion areas can be substantially the same as each other while simplifying a manufacturing process.

On the other hand, in the prior art, for example, in a first solar cell and a second solar cell in which inclined portions are positioned at the opposite sides of a mother solar cell, bus bar electrodes of electrodes are formed at opposite sides, and then, one of the first and second solar cells is rotated so that the inclined portions and the bus bar electrodes are positioned at the same position in the first and second solar cells. For example, in the mother solar cell, the bus bar electrodes in the first and second solar cells are formed to be adjacent to an edge along a major axis far away from the inclined portion, the bus bar electrodes in the first and second solar cells are symmetrical to each other, and the first and second solar cells have the same positions or shape after rotation. Therefore, a manufacturing process may be complicated because a process of rotating one of the first and second solar cells should be added when connecting the first and second solar cells after manufacturing a mother solar cell and cutting the mother solar cell.

Also, in the prior art, the widths of the first and second solar cells may be the same as each other, and the width of the third solar cell may be the same as that of the first and second solar cells. Therefore, in the prior art, even though the bus bar electrodes are formed at different sides of the first and second solar cells, the widths thereof are the same. Thus, when a solar cell string is formed by connecting a plurality of solar cells, the amounts of current generated in the first to third solar cells are different. Then, since the current flows at the smallest amount of current, the excess current is not used in the solar cell even a larger amount of current is generated. Therefore, the output of the solar cell panel may be lowered.

Contrary to the above, in the implementation, the first solar cell 10a and the second solar cell 10b are connected to each other in the state that the inclined portions 12a and 12b are symmetrically positioned to each other when seen in a direction of the minor axis. Thus, a process of rotating one of the solar cells 10 can be omitted. Instead, a relative position of the inclined portion 12a or 12b or the cut surface CS (or the non-cut surface NCS) and the bus bar electrode 42b of the front electrode 42 are different from each other, and thus, the first and second solar cells 10a and 10b are formed asymmetrically or have different widths so that the photoelectric conversion areas can be the same. Also, the third solar cell 10c is formed to have a smaller width than the first and second solar cells 10a and 10b in consideration of the shape thereof and the photoelectric conversion areas of the first to third solar cells 10a, 10b, and 10c can be kept at the same or similar level as a whole.

For example, a distance between one side (a left side of the drawing) of the first solar cell 10a and one end of the finger electrode 42a adjacent thereto may be substantially the same as the first distance D1 (for example, the distance and the first distance D1 have a difference within 10%), or larger than the first distance D1. More specifically, the distance between the one side of the first solar cell 10a and the one end of the finger electrode 42a adjacent thereto may be larger than the first distance D1. This is because the one end of the finger electrode 42a of the first solar cell 10a is positioned adjacent to the non-cut surface NCS and the other end of the first electrode (e.g., the first bus bar electrode 421b) is positioned adjacent to the cut surface CS. Also, a distance between one side of the second solar cell 10b and one end of the finger electrode 42a adjacent thereto may be substantially the same as the second distance D2 (for example, the distance and the second distance D2 may have a difference within 10%). or smaller than the second distance D2. More specifically, the distance between the one side of the second solar cell 10b and the one end of the finger electrode 42a adjacent thereto may be smaller than the second distance D2. This is because the one end of the finger electrode 42a of the second solar cell 10b is positioned adjacent to the cut surface CS and the other end of the second electrode (e.g., the second bus bar electrode 422b) is positioned adjacent to the non-cut surface NCS. Further, a distance between one side of the third solar cell 10c and one end of the finger electrode 42a adjacent thereto may be substantially the same as the third distance D3 (for example, the distance and the third distance D3 may have a difference within 10%). This is because the one end of the finger electrode 42a of the third solar cell 10c and the other end of the third electrode are positioned adjacent to the cut surfaces CS. However, implementations of the invention are not limited thereto. Thus, the distance between the one side of the first, second, or third solar cell 10a, 10b, or 10c and the one end of the finger electrode 42a adjacent thereto may be substantially the same as the first, second, or third distance D1, D2, or D3, or less than or larger than the first, second, or third distance D1, D2, or D3.

In the above description, the front electrode 42 or the back electrode 44 includes the bus bar electrodes 42b and 44b. However, implementations of the invention are not limited thereto.

Figure 6:
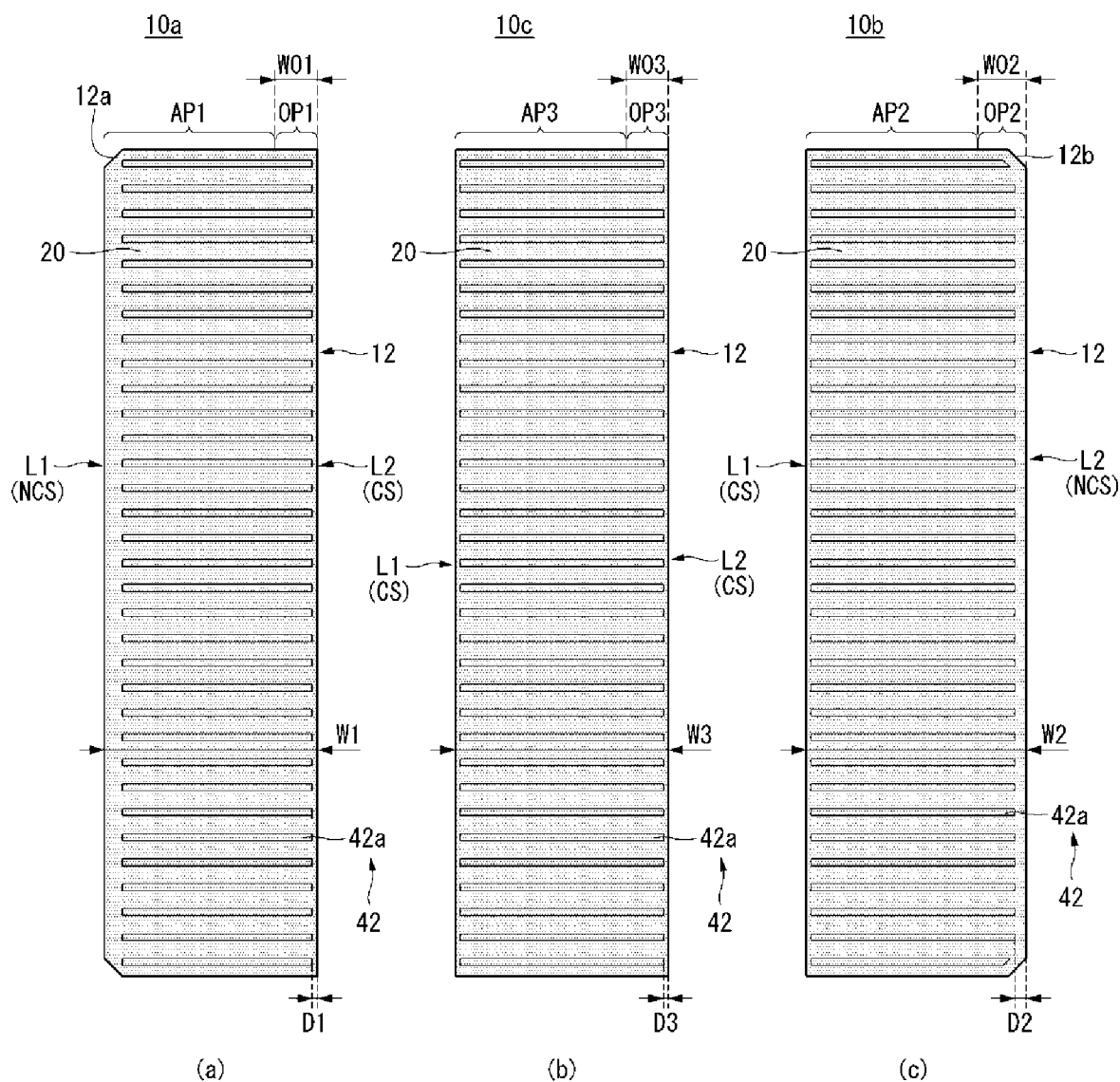
FIG. 6 is front plan views showing first to third solar cells included in a solar cell panel according to a modified implementation of the invention.

Therefore, as one modified implementation, a front electrode 42 does not include a bus bar electrode 42b as shown in FIG. 6. In this instance, a plurality of finger electrodes 42a, which are formed in parallel with each other along the minor axis, may be spaced apart from each other in the major axis in the overlapped portion OP, and a connecting member 142 may be connected to a portion of the finger electrodes 42a. For example, the connecting member 142 may be in contact with the plurality of finger electrodes 42a and the first insulating layer positioned therebetween. According to this structure, the bus bar electrode 42b may be omitted and thus a material cost can be reduced and a width of an overlapped portion OP can be minimized.

In order to stably position the connecting member 142 even when the bus bar electrode 42b is not provided as described above, a first or third distance D1 or D3 from the other ends (right ends of FIG. 6) of the plurality of finger electrodes adjacent to the overlapped portion OP1 or OP3 positioned at the other side portion of the first or third solar cell 10a or 10c to the other side of the first or third solar cell 10a or 10c may be different from a second distance D2 from the other ends of the plurality of finger electrodes adjacent to the overlapped portion OP2 positioned at the other side portion of the second solar cell 10b to the other side of the second solar cell 10b. For example, as described above, the second distance D2 may be larger than the first or third distance D1 or D3. That is, in the implementation with reference to FIG. 6, widths of the first to third solar cells 10a, 10b, 10c (or first to third effective portions AP1, AP2, AP3 and the first to third overlapped portions OP1, OP2, and OP3 included therein) may have the same relationship as described in the above-described implementation with reference to FIG. 5.

Although the front electrode 42 is described and shown in the above and FIG. 6 as an example, the back electrodes may include a plurality of finger electrodes spaced apart from each other in an overlapped portion OP without a bus bar electrode. In this case, the plurality of finger electrodes of the back electrode formed along a minor axis in the overlapped portion OP may be spaced apart from each other in the major axis, and a connecting member 142 may be connected to portions of the plurality of the finger electrodes of the back electrode in overlapped portion OP. For example, the connecting member 142 may be in contact with the plurality of finger electrodes of the back electrode and a second insulating layer positioned therebetween.

The above-described features, structures, effects, and the like are included in at least one implementation of the invention, and are not necessarily limited to only one implementation. Further, the features, structures, effects and the like illustrated in the implementations may be combined and modified by persons skilled in the art to which the implementations are pertained. Therefore, it is to be understood that implementations of the invention are not limited to these implementations, and various combined and modified implementations are included in a scope of the invention.

What is claimed is:

1. A solar cell panel having a first edge and a second edge opposite the first edge, the solar cell panel comprising:
   a plurality of solar cells comprising a first solar cell, a second solar cell, and one or more intermediate solar cells disposed between the first solar cell and the second solar cell, wherein each of the plurality of solar cells includes:
      a first lateral side facing the first edge of the solar cell panel and extending in a first direction;
      a second lateral side facing the second edge of the solar cell panel and extending in the first direction, wherein the first lateral side and the second lateral side are spaced apart from each other in a second direction that is perpendicular to the first direction; and
      an upper surface and a lower surface extending between the first and second lateral sides, the upper and the lower surfaces spaced apart from each other in a third direction perpendicular to the first and second directions;
   wherein the first solar cell has a first chamfer at the first lateral side of the first solar cell and the first solar cell has an upper electrode on the upper surface thereof adjacent the second lateral side of the first solar cell, the upper electrode of the first solar cell spaced from the second lateral side of the first solar cell by a first spacing distance,
   wherein the second solar cell has a second chamfer at the second lateral side of the second solar cell and the second solar cell has a lower electrode on the lower surface thereof adjacent the first lateral side of the second solar cell, wherein the second solar cell has an upper electrode on the upper surface thereof adjacent to the second lateral side of the second solar cell, the upper electrode of the second solar cell spaced from the second lateral side of the second solar cell by a second spacing distance, wherein the second spacing distance is greater than the first spacing distance, wherein each intermediate solar cell has a rectangular shape that includes the first and second lateral sides of the intermediate solar cell, each intermediate solar cell has an upper electrode on the upper surface thereof adjacent the second lateral side of the intermediate solar cell, the upper electrode of each intermediate solar cell spaced from the second lateral side of the intermediate solar cell by a third spacing distance, and each intermediate solar cell has a lower electrode on the lower surface thereof adjacent the first lateral side of the intermediate solar cell, wherein the first solar cell has a first width in the second direction which is a maximum width of the first solar cell, the second solar cell has a second width in the second direction which is a maximum width of the second solar cell, and each intermediate solar cell has a third width in the second direction which is a maximum width of each intermediate solar cell, wherein the third width is less than each of the first width and the second width, and wherein the first width is less than the second width, wherein a portion of the first solar cell that includes the upper electrode and the second lateral side thereof is overlapped in the third direction by a portion of a first adjacent one of the intermediate solar cells that includes the lower electrode and the first lateral side thereof, such that the first solar cell has a first overlapped portion, wherein a portion of the second solar cell that includes the lower electrode and the first lateral side thereof overlaps in the third direction with a portion of a second adjacent one of the intermediate solar cells that includes the upper electrode and the second lateral side thereof, such that the second solar cell has a second overlapped portion and the second adjacent one of the intermediate solar cells has a third overlapped portion, wherein the solar cell panel further comprises a first connecting member connecting the upper electrode of the first solar cell to the lower electrode of the first adjacent one of the intermediate solar cells and a second connecting member connecting the upper electrode of the second adjacent one of the intermediate solar cells to the lower electrode of the second solar cell, wherein each of a width of the first overlapped portion of the first solar cell in the second direction, a width of the third overlapped portion of the second adjacent one of the intermediate solar cells, the first spacing distance, the second spacing distance, the third spacing distance, the first width of the first solar cell, the second width of the second solar cell, and the third width of the one or more intermediate solar cells are all configured so that when the first solar cell, the second solar cell, and the one or more intermediate solar cells are connected to one another via the first and second connecting members, a photoelectric conversion area of each of the plurality of the solar cells is the same and a current flow of each of the plurality of solar cells is the same, and wherein the upper electrode of the first solar cell is a first bus bar electrode that is located at the second lateral side of the first solar cell, the second lateral side of the first solar cell being a cut surface, and wherein the second solar cell includes a second bus bar electrode that is located at the second lateral side of the second solar cell and on the upper surface thereof, the second lateral side of the second solar cell being a non-cut surface.

2. The solar cell panel of claim 1, wherein a shape of the photoelectric conversion area of the first solar cell is different than a shape of the photoelectric conversion area of the second solar cell, and the shape of the photoelectric conversion area of each of the one or more intermediate solar cells is different than the shapes of the first and second solar cells.

3. The solar cell panel of claim 1, wherein a ratio of the second width of the second solar cell in the second direction to the first width of the first solar cell in the second direction is between 1.018 and 1.055.

4. The solar cell panel of claim 1, wherein at least one of the plurality of solar cells includes a plurality of finger electrodes that extend in the second direction and that are spaced apart from one another in the first direction.

5. The solar cell panel of claim 1, wherein a ratio of the second width of the second solar cell in the second direction to the first width of the first solar cell in the second direction is between 1.018 and 1.055, and
    wherein a ratio of the second width of the second solar cell in the second direction to the third width of each of the one or more intermediate solar cells in the second direction is between 1.036 and 1.105.

6. The solar cell panel of claim 1, wherein a ratio of a width of at least one of the plurality of solar cells in the second direction to a length of the at least one of the plurality of solar cells in the first direction is between 2.5 and 12.5.

7. The solar cell panel of claim 1, wherein each of the one more intermediate solar cells has four corners each having a right angle.

8. The solar cell panel of claim 1, wherein the plurality of solar cells are arranged along the second direction.

9. The solar cell panel of claim 1, wherein each of the first, second, and intermediate solar cells have a pair of short sides that extend in the second direction, wherein a length of each of the lateral sides is greater than a length of each of the short sides.

10. A solar cell panel comprising:
    a plurality of solar cells including a first solar cell, a second solar cell, and an intermediate solar cell arranged between the first and second solar cells, wherein each solar cell of the plurality of solar cells has respective lengths in a first direction and respective widths in a second direction, and wherein each solar cell of the plurality of solar cells includes a first side and a second side which extend along the first direction and are opposite to each other and determined with respect to the second direction; and
    one or more connecting members that electrically connect two adjacent solar cells of the plurality of solar cells,
    wherein the first solar cell includes a first chamfer portion at the first side of the first solar cell,
    wherein the second solar cell includes a second chamfer portion at the second side of the second solar cell,
    wherein a first width of the first solar cell in the second direction is a maximum width of the first solar cell and is different from a second width of the second solar cell in the second direction, the second width being a maximum width of the second solar cell,
    wherein a third width of the intermediate solar cell in the second direction is a maximum width of the intermediate solar cell, is less than the first width of the first solar cell, and is less than the second width of the second solar cell, and wherein when the first, second, and intermediate solar cells are connected to one another via the one or more connecting members, a photoelectric conversion area of each solar cell of the plurality of the solar cells is the same such that a current flow of each solar cell of the plurality of the solar cells is the same, wherein the first solar cell has an upper electrode on an upper surface thereof adjacent the second side of the first solar cell, the upper electrode of the first solar cell spaced from the second side of the first solar cell by a first spacing distance, wherein the second solar cell has a lower electrode on a lower surface thereof adjacent the first side of the second solar cell and has an upper electrode on an upper surface thereof adjacent the second side of the second solar cell, the upper electrode spaced from the second side of the second solar cell by a second spacing distance, wherein each intermediate solar cell has an upper electrode on an upper surface thereof adjacent the second side of the intermediate solar cell, the upper electrode of each intermediate solar cell spaced from the second side of the intermediate solar cell by a third spacing distance, wherein the second spacing distance is greater than the first spacing distance, and wherein the upper electrode of the first solar cell is a first bus bar electrode that is located at the second side of the first solar cell, the second side of the first solar cell being a cut surface, and wherein the second solar cell includes a second bus bar electrode that is located at the second side of the second solar cell and on the upper surface thereof, the second side of the second solar cell being a non-cut surface.

11. The solar cell panel of claim 10,
wherein each intermediate solar cell has a lower electrode on a lower surface thereof adjacent the first side of the intermediate solar cell.

12. The solar cell panel of claim 10, wherein the third spacing distance is less than the second spacing distance.

13. The solar cell panel of claim 11, wherein
wherein a portion of the first solar cell that includes the upper electrode and the second side thereof is overlapped in a third direction by a portion of the first side of the adjacent intermediate solar cell that includes the lower electrode such that the first solar cell has a first overlapped portion, wherein the third direction is perpendicular to the first and second directions; and
wherein a portion of the second solar cell that includes the lower electrode and the first side thereof overlaps in the third direction with a portion of a second side of the intermediate solar cell that includes the upper electrode such that the second solar cell has a second overlapped portion and the intermediate solar cell has a third overlapped portion.

14. The solar cell panel of claim 13, wherein the first overlapped portion has a width measured in the second direction, wherein the second overlapped portion has a width measured in the second direction, and wherein the width of the second overlapped portion is larger than the width of the first overlapped portion.

* * * * *